(12) United States Patent
Vukosic

(10) Patent No.: US 6,844,824 B2
(45) Date of Patent: Jan. 18, 2005

(54) MULTI COLOR AND OMNI DIRECTIONAL WARNING LAMP

(75) Inventor: Stephen T. Vukosic, Rochester, NY (US)

(73) Assignee: Star Headlight & Lantern Co., Inc., Avon, NY (US)

( * ) Notice: Subject to any disclaimer, the term of this patent is extended or adjusted under 35 U.S.C. 154(b) by 0 days.

(21) Appl. No.: 10/253,744

(22) Filed: Sep. 24, 2002

(65) Prior Publication Data

US 2003/0020627 A1 Jan. 30, 2003

Related U.S. Application Data

(63) Continuation of application No. 09/417,729, filed on Oct. 14, 1999, now Pat. No. 6,483,439.

(51) Int. Cl.[7] .................................................. G08B 5/00
(52) U.S. Cl. ............................ 340/815.65; 340/815.45; 362/800
(58) Field of Search ........................ 340/815.65, 815.4, 340/815.46, 815.45, 815.55; 362/800, 459, 35, 487

(56) References Cited

U.S. PATENT DOCUMENTS

| | | | |
|---|---|---|---|
| 4,161,018 A | 7/1979 | Briggs | |
| 4,271,408 A | 6/1981 | Teshima et al. | |
| 4,742,432 A | 5/1988 | Thillays et al. | |
| 4,935,665 A | 6/1990 | Murata | |
| 5,136,287 A | 8/1992 | Borenstein | |
| 5,184,114 A | 2/1993 | Brown | |
| 5,224,773 A | 7/1993 | Arimura | |
| 5,268,828 A | 12/1993 | Miura | |
| 5,436,535 A | 7/1995 | Yang | |
| 5,585,783 A | 12/1996 | Hall | |
| 5,594,433 A | 1/1997 | Terlep | |
| 5,688,042 A | 11/1997 | Madadi | |
| 5,726,535 A | 3/1998 | Yan | |
| 5,765,940 A | 6/1998 | Levy et al. | |
| 5,806,965 A | 9/1998 | Deese | |
| 5,890,794 A | 4/1999 | Abtahi | |
| 5,929,788 A | 7/1999 | Vukosic | |
| 6,086,220 A | 7/2000 | Lash | |
| 6,183,100 B1 * | 2/2001 | Suckow | 362/35 |
| 6,380,865 B1 | 4/2002 | Pederson | |
| 2002/0048174 A1 | 4/2002 | Pederson | |

* cited by examiner

Primary Examiner—Anh V. La
(74) Attorney, Agent, or Firm—Kenneth J. Lukacher; Martin Lukacher

(57) ABSTRACT

A warning lamp, provides multi status indication by being illuminated in selected ones of a plurality of colors or by flashing a selected color or colors sequentially. The lamp has a pair of printed circuit boards disposed, one in a base and another upstanding from the base along a central axis, extending midway through the upstanding board. Around the upstanding board and coaxial therewith is a lens which is mounted in assembled relationship with the boards and the base. The upstanding board has arrays of light emitting diodes (LEDs), disposed along spaced lines which are parallel to the axis. The LEDs along different lines provide light of different color, for example, red, green and amber. The printed circuit boards provide a subassembly in which the bottom portion of the upstanding board and the other board are contained in a plastic casting disposed in a recess in the base. The boards carry circuits and circuit components which connect the arrays to leads which extend through the base and which carry current for each of the groups of lamps in the arrays so that they may be selectively illuminated or illuminated in sequence.

10 Claims, 8 Drawing Sheets

MULTI COLOR AND OMNI DIRECTIONAL WARNING LAMP

This application is a continuation of U.S. patent application Ser. No. 09/417,729, filed Oct. 14, 1999 now U.S. Pat. No. 6,483,439.

The present invention relates to lamps for providing warning and/or status indications and particularly to lamps which provide such warnings and status illuminations in terms of the color or sequence of colors which the lamp is caused to radiate. The radiation from the lamp is omnidirectional so as to provide an omnidirectional beacon.

The lamp provides illumination, which can be in a multiplicity of colors, omnidirectionally, without the need of optical elements such as reflectors to direct the illumination in an omnidirectional pattern. The lamp provided by the invention may be implemented by a circuit board which extends along an axis about which illumination radiates omnidirectionally. The board has arrays of sources on opposite side surfaces thereof, preferably in lines of sources which parallel the axis. When multicolor illumination is desired, the sources in each line may radiate a different color. The board may be an upstanding printed circuit board mounted on another board which carries current to the sources in the array. The boards provide a subassembly which may be mounted in the base of the lamp and covered by a transparent cover which may have striations so as to provide a Fresnel type lens. The base may be mounted on a panel so that the axis extends generally perpendicular to the panel. The sources are preferably LEDs which are mounted on the opposite side surfaces of the upstanding boards. These LEDs are preferably of the type which emit light in a relatively wide angle generally cone shaped radiation pattern which includes an angle of about 120°, thereby avoiding blind spots in the omnidirectional radiation from the lamp.

LED lamps have been proposed wherein the LEDs are in a panel. Special reflectors are utilized to project illumination in a generally perpendicular direction away from the panel. See U.S. Pat. No. 5,765,940, issued Jun. 16, 1998; U.S. Pat. No. 5,184,114, issued Feb. 2, 1993; U.S. Pat. No. 5,436,534, Jul. 25, 1995; U.S. Pat. No. 5,594,433, Jan. 4, 1997; and U.S. Pat. No. 4,271,408, Jun. 2, 1991. Where omnidirectional radiation is desired, radial or circular arrays of LED sources have been proposed. In order to provide omnidirectional radiation from the sources emanating via the sides of the lamp, optics such as reflectors have been used to turn and distribute the illumination from the sources. See U.S. Pat. No. 5,224,773 issued Jul. 16, 1993, and Vukosic U.S. Pat. No. 5,929,788, issued Jul. 27, 1999, as well as the patents cited therein.

Accordingly, it is a principal feature of the invention to provide an improved lamp capable of providing omnidirectional illumination from an array of light sources carried on a printed circuit board, and particularly on opposite side surfaces of the board.

It is a further feature of the present invention to provide a lamp which emits light in a plurality of colors omnidirectionally, 360° about an axis and can provide such colors selectively and in selected sequences.

It is still another feature of the invention to provide an improved multicolor omnidirectional warning or status indicator lamp which does not require optics for projecting and directing illumination from an array of lamps mounted in generally coplanar relationship on a board, thereby enabling to be implementations at lower cost than lamps having similar capabilities, which have heretofore been available.

Briefly described, a lamp in accordance with the invention, which provides illumination omnidirectionally 360° about an axis, has a first board disposed perpendicular to the axis and a second board mounted on the first board and disposed along the axis. The second board has opposite sides. Light source elements, preferably LEDs are mounted in arrays on both of the sides of the second board. A transparent cover is disposed around the second board in assembled relationship with the boards, as by being connected to a base in which a subassembly of the first and second boards are disposed, with the second board upstanding from the base. Lamps in the arrays may be of different color along different lines in the arrays. These lines are preferably parallel to the axis and distributed over a substantial portion of the surfaces of the boards so that the illumination is in a wide angle beacon 360° about the axis.

The foregoing and other objects, features and advantages of the invention will becomes more apparent from a reading of the following description in connection with the accompanying drawings in which:

FIGS. 1 and 2 are sectional views, along planes 90° with respect to each other along lines 1—1 and 2—2 in FIG. 7, respectively and showing a warning or status indicator lamp provided in accordance with the presently preferred embodiment of the invention;

Figure 6A:
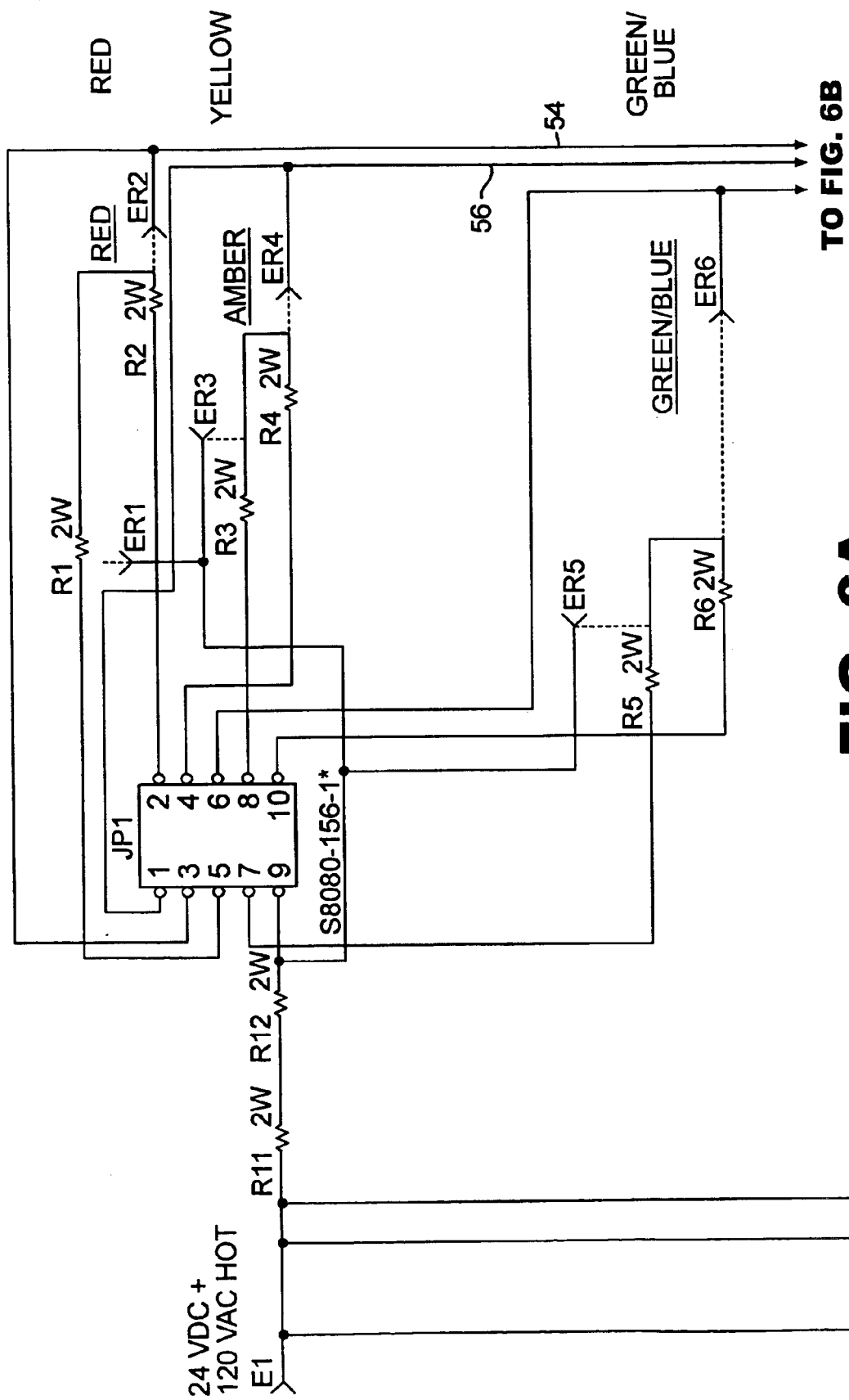
FIGS. 6A and 6B is a schematic diagram illustrating the circuit for operating the arrays of lamps shown in FIG. 5.
Figure 6B:
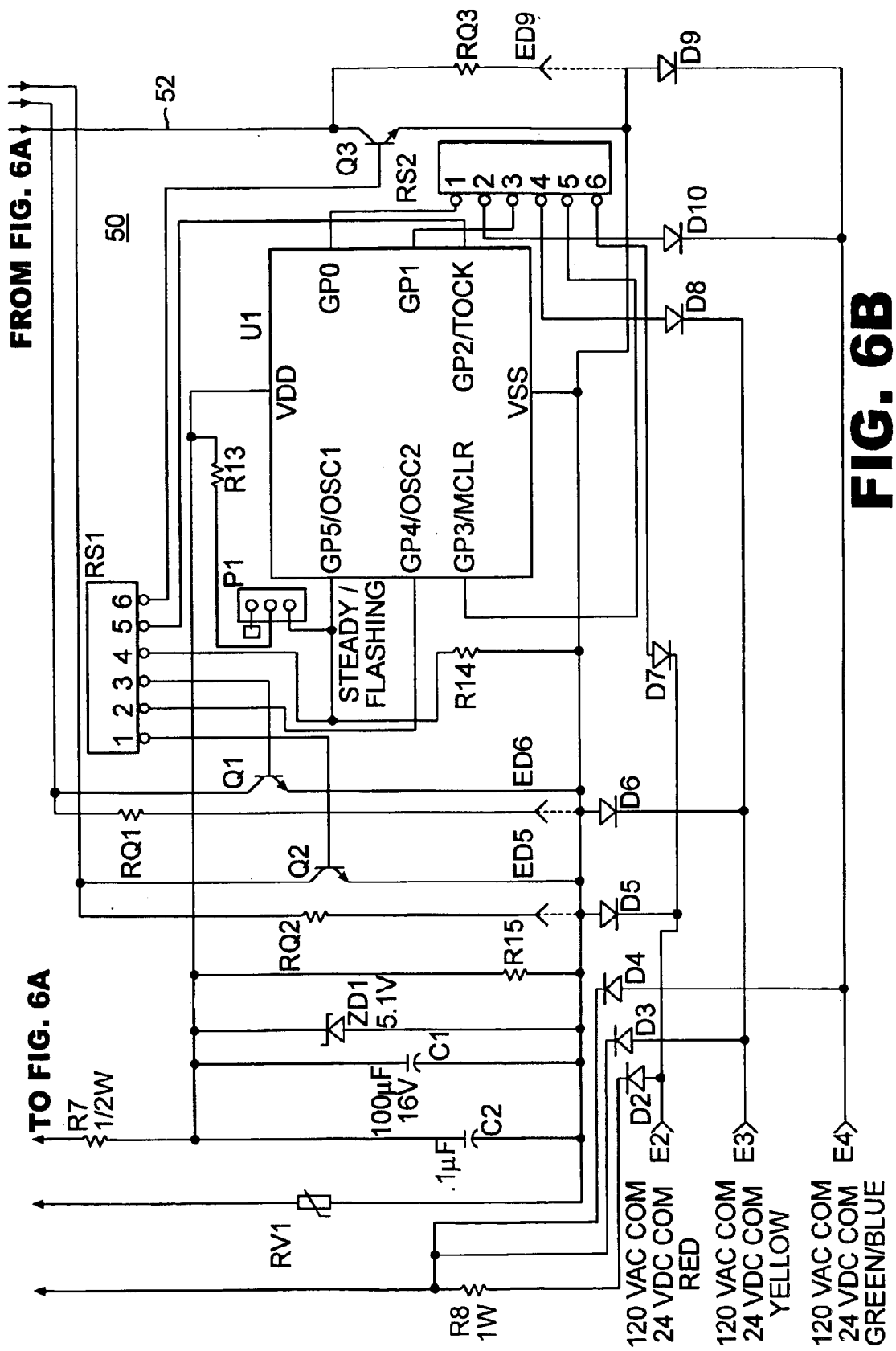
Figure 7:
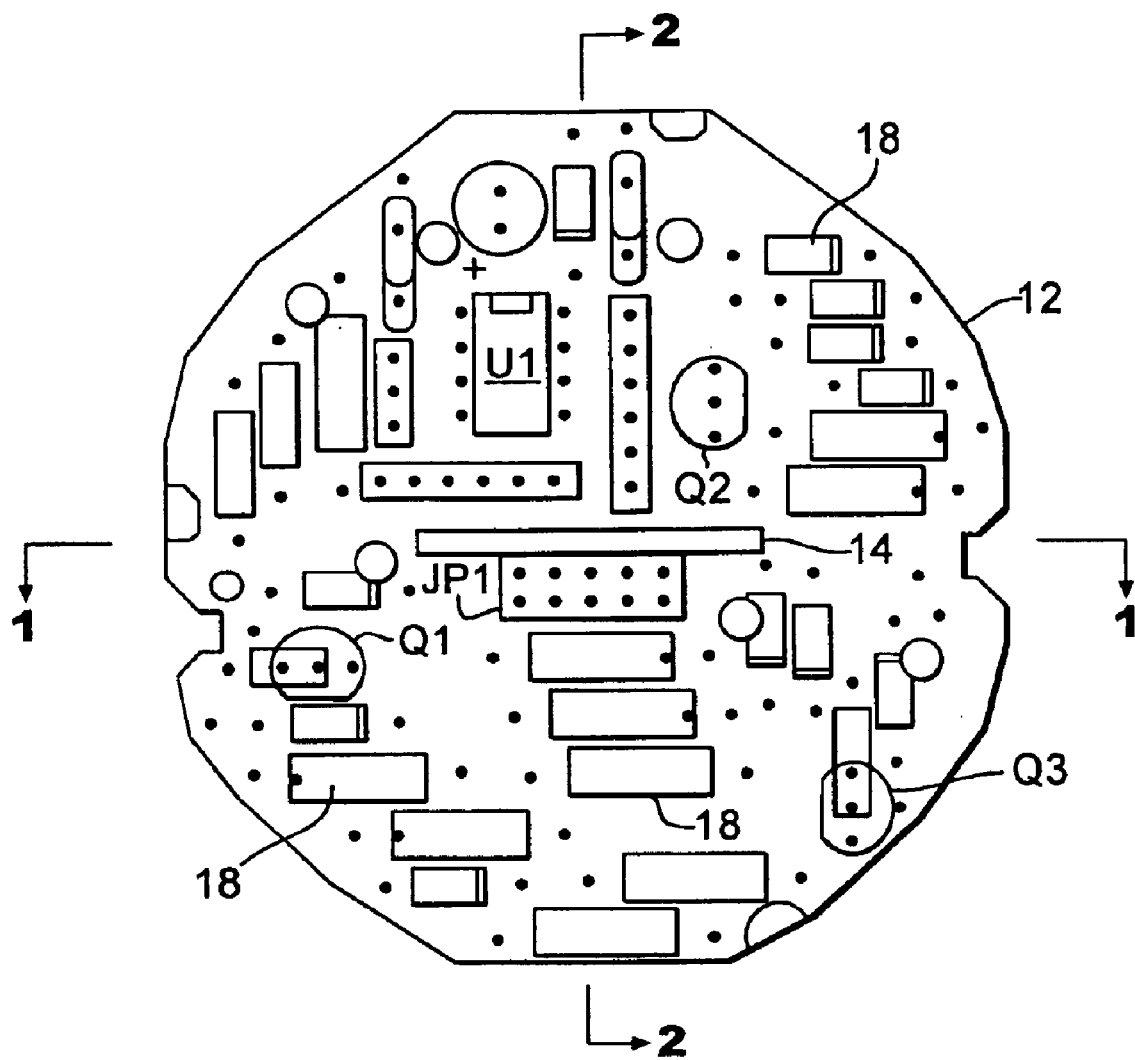
FIG. 7 is a plan view of the lower board containing the circuits via which power is provided to energize the LEDs in the arrays of LEDs on opposite sides of the upstanding board shown in the preceding figures.

Referring to FIGS. 1, 2, 3, 4, and 7, the lamp provided by this invention is made up of a subassembly 10 of a first printed circuit board 12 and a second printed circuit board 14 which are disposed perpendicular to each other. The first board 12 is generally circular in a plan view as shown in FIG. 7. This board mounts the electrical components of the lamp which control and carry current to arrays 16 and 18 of LEDs. See FIG. 6.

The arrays have 6 lines of LEDs which are generally parallel to each other and to the longitudinal edges of the board 14. The arrays 16 and 18 are on opposite side surfaces of the board. These opposite side surfaces are indicated as 14a and 14b in FIG. 4. The diodes in each line emit different colors, namely green or blue, amber (by which term yellow is included) and red. The colors are indicated by the color code in FIG. 4. One of the side surfaces 14a is the top or component side of the PC board 14, while the other side surface 14b is the bottom or copper side of the board 14. A connector JP1 which is attached to the lower board 12 attaches the upstanding board 14 to the lower board so that the lower edge along the width of the upstanding board 14 is adjacent to the upper surface of the lower board 12. The subassembly 10 is potted or cast in a body 17 of plastic which also maintains the boards 12 and 14 assembled thereby providing the subassembly 10.

Figure 1:
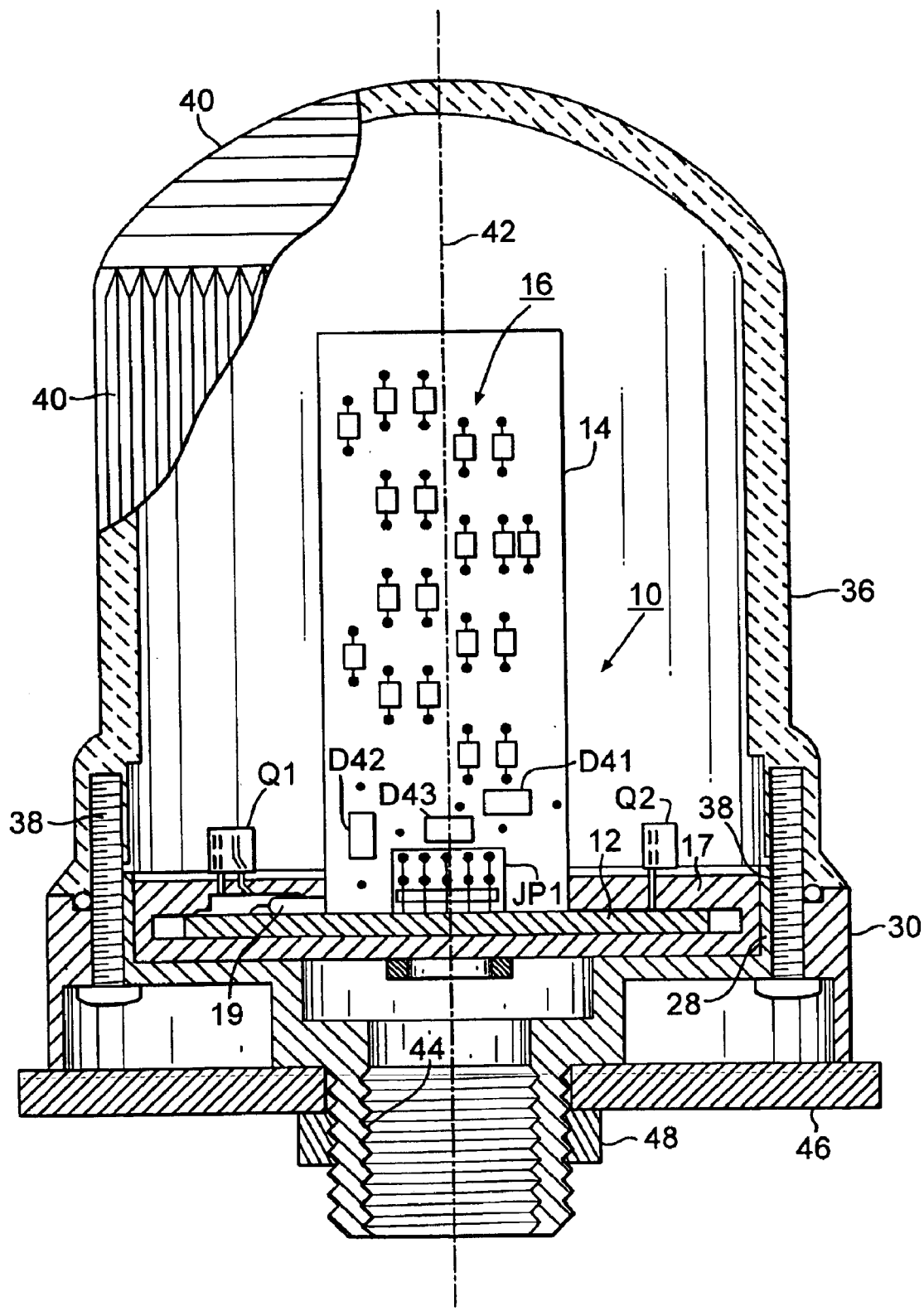
Figure 2:
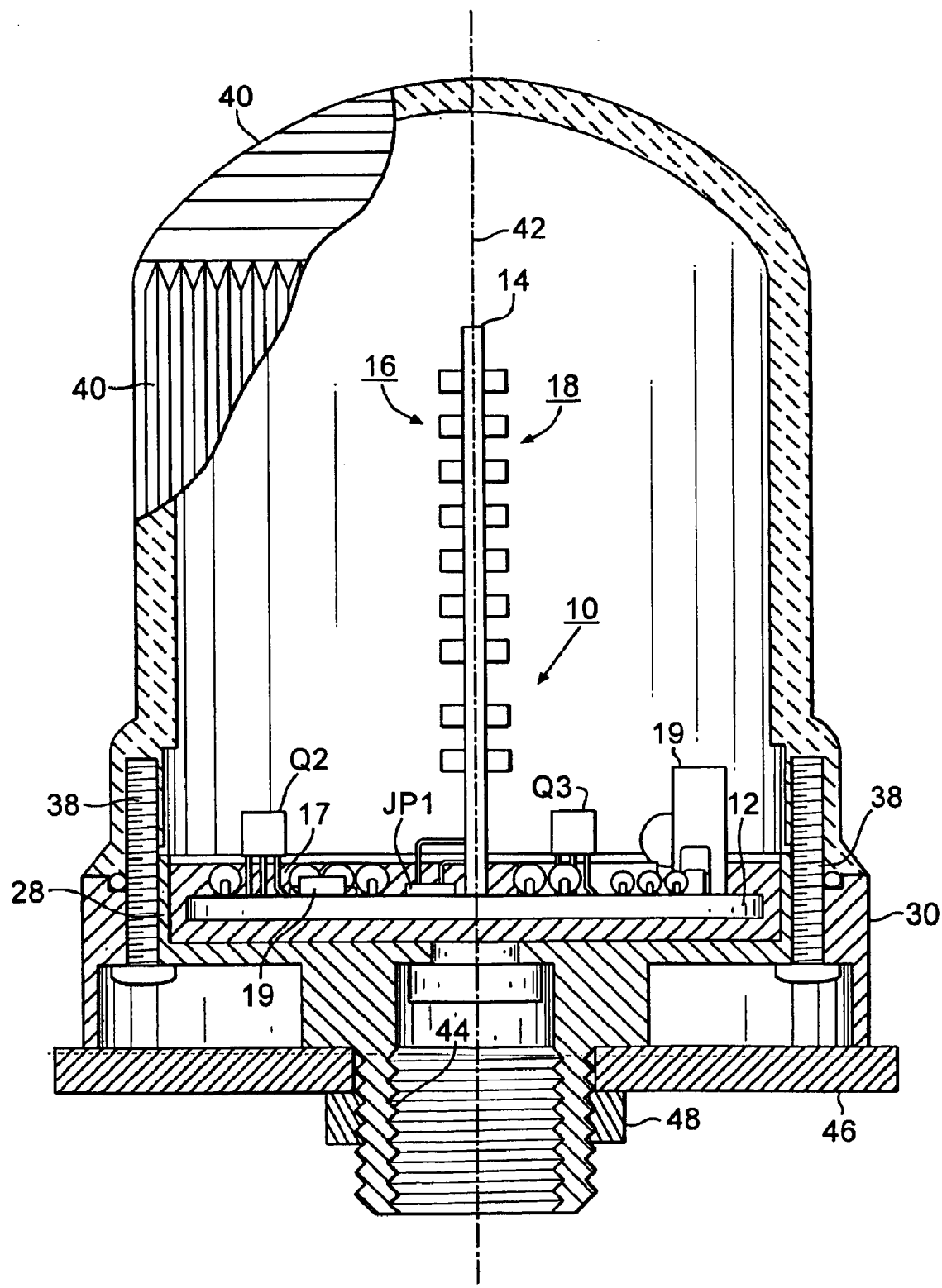
Figure 4:
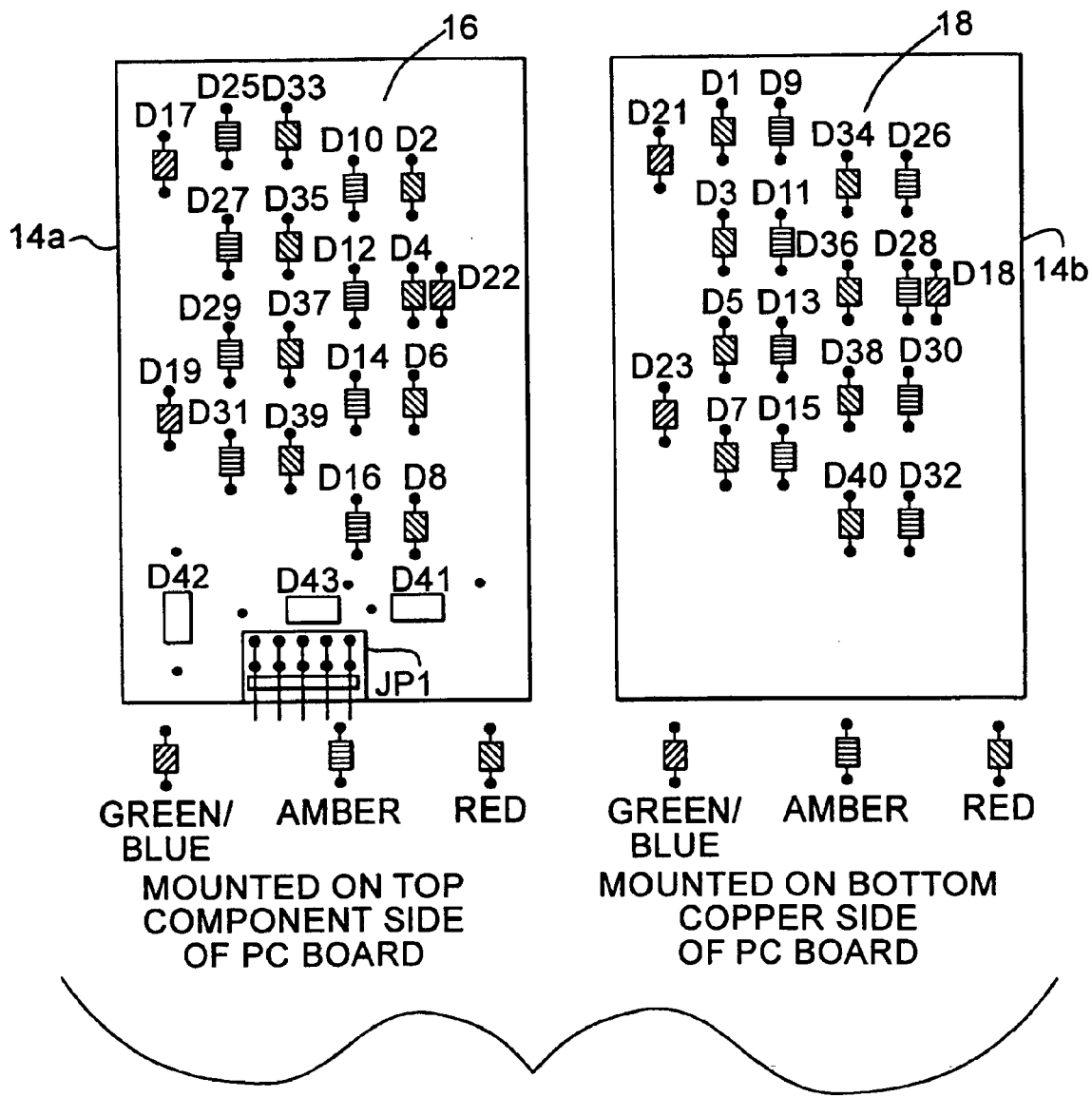
FIG. 4 are side views illustrating the side surfaces of the upstanding board on which arrays of LEDs are mounted, the board being disposed along the axis about which light is emitted omnidirectionally.

The components, transistors and resistors and integrated circuits, on the lower board 12 are laid out as indicated in FIG. 7. Some of these components including two of the transistors Q1 and Q2 extend above the plastic body 17. The components on the lower board 12, which are shown in FIGS. 1, 2 and 4, are indicated by the referenced numeral 19. In addition to the LEDs on the upstanding board 14, there are three diodes which are shown as D41, 42 and 43 in the circuit diagram of the LED arrays in FIG. 5. The black dots on the surfaces of the boards 12 and 14 indicate holes for the passage of conductors.

Figure 3:
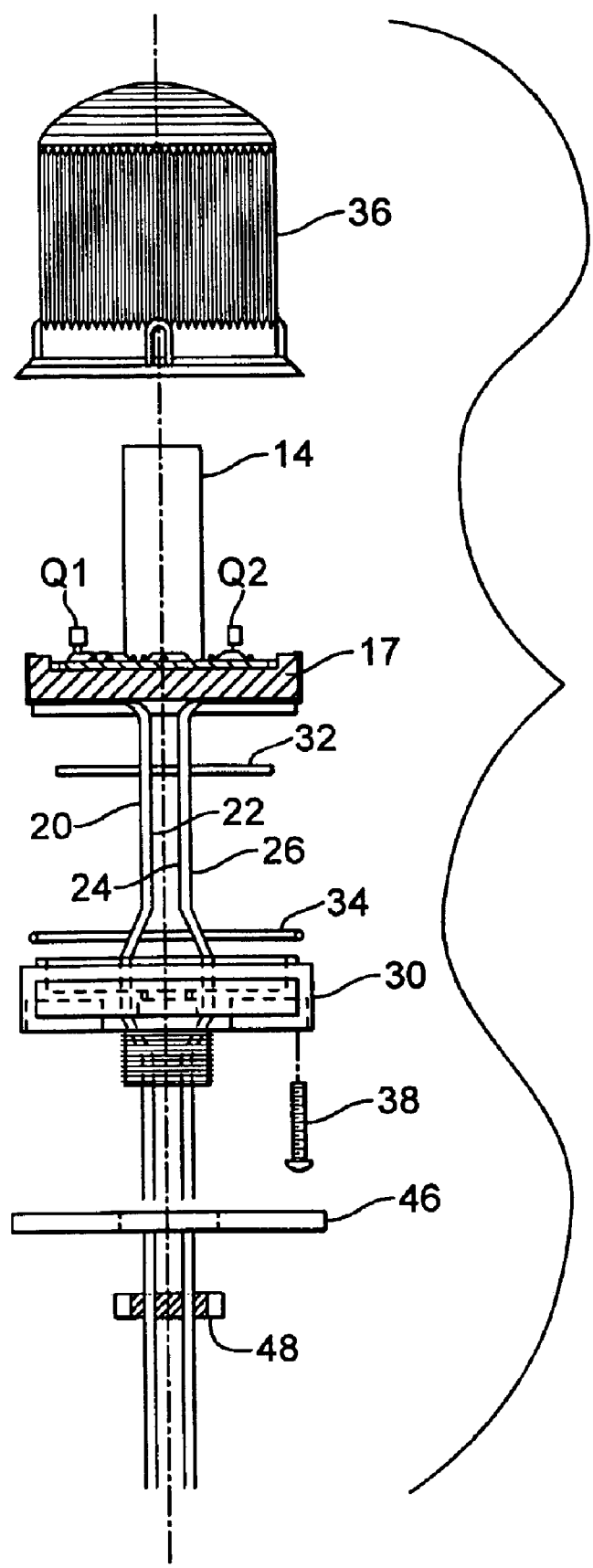
FIG. 3 is an exploded view of the lamp shown in FIGS. 1 and 2.

There are four leads (long insulated conductors 20, 22, 24, and 26) which are shown in FIG. 3 and are connected to the lamp circuits on the lower board 12. The subassembly 10 is received in a recess 28 in a base 30. The base is generally cylindrical as is the recess 28. The subassembly 10 may be attached by double sided tape (two crossed strips 32, one of which is shown in FIG. 3). An O-ring 34, to provide a water resistant seal, is disposed between a transparent cover 36 which is attached to the base by means of screws 38 so as to maintain the base 30 with the subassembly 10 and the cover 36 and assembled relationship.

The cover 36 also has striations or lenticular hills 40 on its outside surface and therefore provides Fresnel lens for distributing the light emitted by the LED arrays 16 and 18 omnidirectionally about a central axis 42 of the lamp assembly. The leads 20, 22, 24, and 26 extend through a threaded open collar 44 of the base 30. A elastic washer 46 which is captured by a screw 48 provides a seal for mounting the lamp on a horizontal surface such as a panel of a machine with which the lamp is used as a status indicator. The LEDs preferably provide a wide angle illumination or radiation pattern which is generally conical with an apex at the LED, and which includes a solid angle of about 120 degrees in which the intensity of illumination does not diminish more than about 50%. Commercially available LEDs which are suitable are for red, HLMT-PH00 or HMSC-S660; for amber, HMLT-PL06; for green, NSCG-6100; and for blue, NSCB100.

The LEDs of the arrays are disposed in staggered relationship so that each line may be connected together in two pairs of lines for each color on the opposite side surfaces 14a and 14b. This provides a group of red LEDs made up of a line of 8, namely D1 through D8 and another line D33 to D40 (See also FIG. 5). The amber LEDs are also in two lines of eight, namely D9 to D16 and D25 to D32. In this embodiment, there are two lines of green or blue LEDs D17 to D19 and D21 to D23. Each line of a different color is interweaved with a line of another color as shown in FIG. 4. The lines are all parallel to the axis 42 and extend the majority of the longitudinal dimension of the cover so as to emit illumination via the cover 36 and be distributed by the lens striations. Not only are the lines parallel to each other, they are also parallel to the axis 42. The lines are desirably as close to the axis 42 as permitted by the size of the LED devices and space required for interconnections.

The LEDs in each group may be illuminated at the same time and the different groups illuminated at different times so as to provide red, amber and green or blue illumination which may connote different status of the equipment or other control function which is to be provided, for example whether the machine which is equipped with the lamp is running, in standby or stopped.

Figure 5:
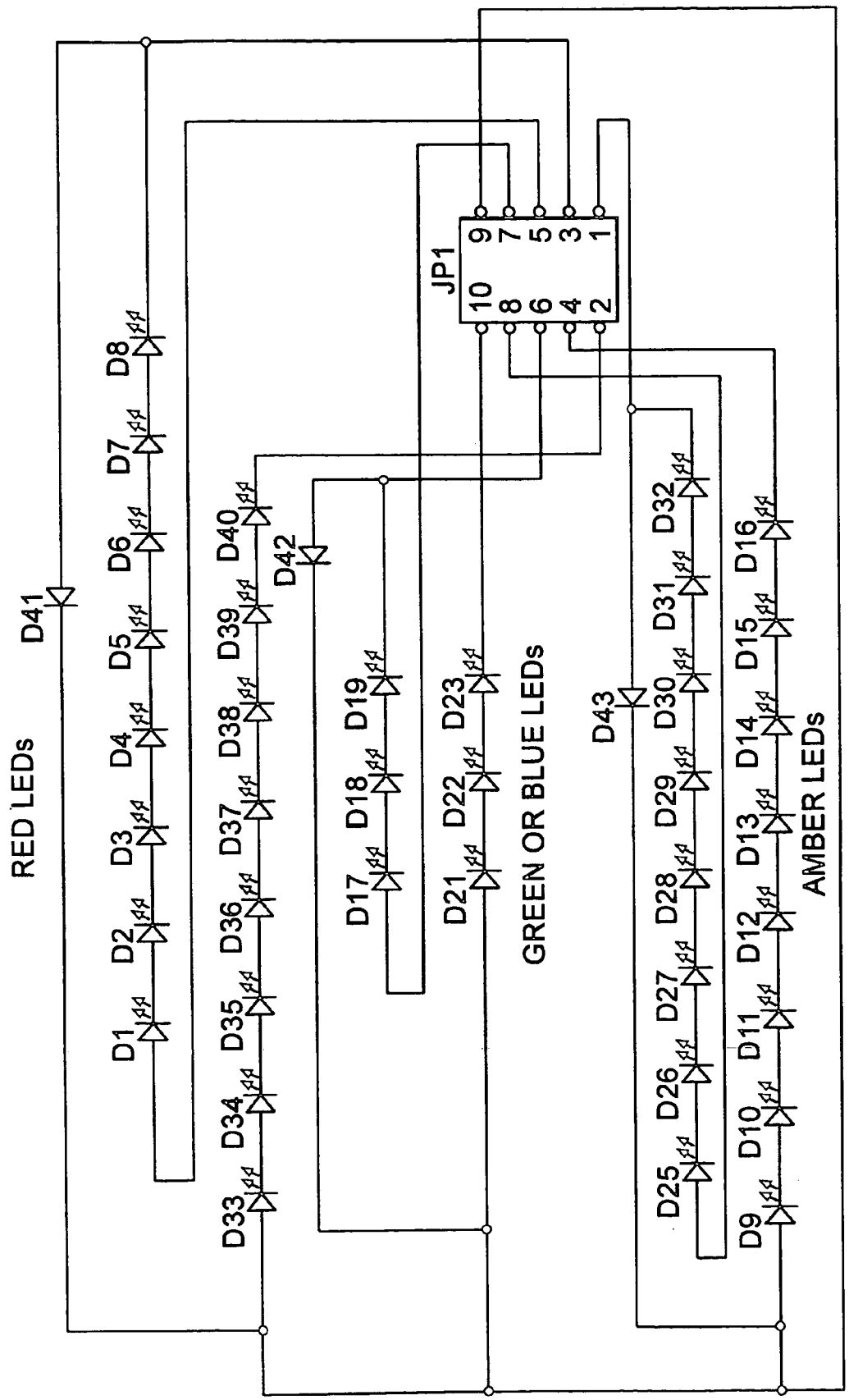
FIG. 5 is a circuit diagram illustrating the connections to the arrays of lamps shown in FIG. 4.

Referring to FIGS. 5, 6A and 6B, there are shown three lines E1 of which may be the hot or positive line and E2, 3 and 4 control lines. The lamp may be set up to operate with DC voltage, say 24 volts DC, or AC voltage, say 120 volt AC. The hot line is connected to terminal E1 which connects to the circuit on the lower board via one of the lines 20, 22, 24 and 26 FIG. 3. The control lines E2, E3 and E4 correspond to the three different color groups of LEDs and are connectable, selectively, to ground. Between the hot line and the ground lines there are diodes D2, D3 and D4 which are connected through a resistor R8 to provide a leakage current path for the control circuits. For example, PLC controllers must have leakage current accommodation.

The groups of red, green or blue and amber LEDs are connected between the JP1 connector and a computerized control circuit or controller 50 having a microprocessor U1. There are three control leads 52, 54, and 56 from the LED lines to the controller 50. These connect to one side of the three pairs of lines, while the other side is connected to the hot line either in parallel when 24 volt DC power is used or in series when 120 volt AC power is used. The series connection is made through resistors R1 and R2 for the red lines, R3 and R4 for the amber or yellow lines and R5 and R6 for the green or blue lines. For parallel operation, the series connected lines of LEDs are connected in parallel via the resistors R1, R2, R3, R4, R5 or R6, separately. In such case the connections between ER1, ER3 and ER5 to the junction between the resistor pairs R1 and R2, R3 and R4, R5 and R6, as shown by the dashed lines are made. This is a factory setup depending upon whether the lamp is to be used for 120 volt AC or 24 volt DC operation. In the event that AC operation is utilized, rectification is provided by diodes D5, D6 and D9 so that the circuitry works on rectified half cycles of the AC power. Power for operating the controller is obtained by a rectifying and voltage limiting Zener diode ZD1 which is paralleled by a capacitor C1 and a resistor R15. The operating power, such as five volts, is thereby generated and applied to the microprocessor U1.

When the lamp is setup for 24 volt DC operation, the connections shown at terminals ED5, ED6 and ED7 by the dashed lines are made. Then the red, amber and green or blue arrays areas selected by applying ground to E2, E3 or E4, respectively.

The controller 50 is used to provide intelligent operation so as to provide different sequences of illumination when more than one control line E2, E3 or E4 is connected to ground. Also the controller may be setup by means of pins P1 to provide steady or flashing illumination of the same color or sequences of colors.

The microprocessor has three detector inputs GP0, GP1 and GP3 which are connected via diodes D6, D7 and D10 to the control terminals E2, E3 and E4. A resistor block having resistive elements between adjacent pairs of terminals 1 and 2, 3 and 4, and 5 and 6 completes the connection to the control terminal E2, E3 and E4 via the diodes D6, D7 and D10. The outputs of the microprocessor GP4, 5, and 6 are connected via a resistor block RS1, which like the block RS2 has resistors between pairs of its terminals 1 and 2, 3 and 4 and 5 and 6, is connected to the base of the control transistors Q1, Q2 and Q3. These transistors are switched on by the microprocessor U1 depending on whether the control terminals E2, E3 and E4 are grounded. Connections between the hot side of the circuit and the grounded terminals for each of the groups of the LEDs (the red, amber and green or blue group) are made via these transistors. The sequence in which the groups of LEDs are powered and illuminated is programmed in the microprocessor U1, as is their flashing cycle, if flashing is enabled by P1.

From the foregoing description, it will be apparent that there has been provided an improved warning or status indicator lamp. Variations and modifications in the herein described lamp, within the scope of the invention will undoubtedly suggest themselves to those skilled in the art. Accordingly, the foregoing description should be taken as illustrative and not in a limiting sense.

What is claimed is:

1. A warning lamp comprising a plurality of groups of light sources connected together, a power conductor, a plurality of independent control conductors respectively corresponding to said groups, a control circuit for connecting selectively each of said conductors to said power conductor, a processor in said control circuit responsive to the state of said control conductors for providing a programmed sequence of connections to said groups for selective powering of said groups.

2. The lamp according to claim 1 wherein said groups each comprise a series of LEDs.

3. The lamp according to claim 2 wherein the LEDs in said series are respectively sources of different colors.

4. A warning lamp which provides selective illumination comprising a support member, a plurality of interconnected groups of LED's, each group emitting light of a selected color when energized so as to provide illumination in multiple colors, said groups being mounted on said member, a processor providing selective connections to each of said groups for selecting energization thereof continuously or sequentially, a plurality of independent control lines each corresponding to different ones of said colors connected to said processor for energizing said groups to provide illumination from said groups in different colors continuously or in sequence of colors.

5. The warning lamp of claim 4 wherein said groups each have a series connected string of LED's.

6. The warning lamp of claim 4 wherein said LED's in said groups are generally red emitting, yellow/amber emitting and green/blue emitting LED's.

7. The lamp according to claim 5 wherein said LED's in said groups are disposed longitudinally spaced from each other on opposite sides of a board supporting and connecting the LED's of said groups so that illumination of each of said colors is outwardly from that opposite sides to provide omni-directional illumination of selected colors from said board.

8. A warning lamp which provides selective illumination comprising a support member, a plurality of interconnected groups of LED's, each group emitting light of a selected color when energized so as to provide illumination in multiple colors, said groups being mounted on said member, a controller providing selective connections to each of said groups for selecting energization thereof continuously or sequentially, a plurality of independent control lines each corresponding to different ones of said colors connected to said controller for energizing said groups to provide illumination from said groups in different colors continuously or in sequence of colors, wherein said control lines corresponding to said colors each connect to a point of relatively low or common potential, a hot one of said control lines being connected to a point of relatively high potential, said controller being a processor which is programmed to provide different ones of said selected sequences of illumination and also steady illumination, said processor having control inputs connected to said control lines and outputs, switching means operated by said processor connected to said outputs for connecting said hot line to different ones of said groups corresponding to said colors.

9. The warning lamp of claim 8 wherein said switching means are transistor switches.

10. A warning signal light comprising a support, a plurality of groups of interconnected LED's mounted on opposite sides of said support and arranged to produce omni-directional illumination from said support, each of said groups emitting a different color when energized, a processor connected in controlling relationship with said groups for selectively energizing said groups in response to independent inputs to said processor to emit said illumination of selected color simultaneously or successively to selectively modulate said illumination.

* * * * *